United States Patent [19]

Shirai et al.

[11] Patent Number: 5,766,825
[45] Date of Patent: Jun. 16, 1998

[54] METHOD OF FORMING A RESIN LAYING IN A SURFACE LAMINATED CIRCUIT

[75] Inventors: Masaharu Shirai, Kusatsu; Shuhichi Okabe, Shiga-ken; Yoshiteru Kohno, Moriyama, all of Japan

[73] Assignee: International Business Machines Corp., Armonk, N.Y.

[21] Appl. No.: 540,684

[22] Filed: Oct. 11, 1995

[30] Foreign Application Priority Data

Nov. 25, 1994  [JP]  Japan .................. 6-291617

[51] Int. Cl.⁶ ............................................ G03F 7/16
[52] U.S. Cl. .................. 430/327; 430/311; 430/330; 427/96; 427/444
[58] Field of Search .................. 430/311, 327, 430/330; 427/264, 265, 266, 444, 96

[56] References Cited

U.S. PATENT DOCUMENTS

| | | | |
|---|---|---|---|
| 4,938,994 | 7/1990 | Choinski | 427/96 |
| 5,265,378 | 11/1993 | Rostoker | 51/165.75 |
| 5,342,739 | 8/1994 | Katou et al. | 430/325 |
| 5,516,729 | 5/1996 | Dawson | 437/228 |

Primary Examiner—Kathleen Duda
Attorney, Agent, or Firm—Richard M. Goldman

[57] ABSTRACT

A method of forming a surface laminated circuit printed circuit board (SLC) where a photosensitive thermosetting resin in solution is applied atop a circuitized substrate. The method starts with the step of concentrating and solidifying the photosensitive thermosetting resin to build up a hardness therein high enough to withstand abrasion. This is done by first dissolving the photosensitive thermosetting resin in a solvent and then applying the solution to a substantially uneven surface. This is followed by evaporating solvent at a temperature below the curing temperature of the photosensitive thermosetting resin. Next, the surface of said resin layer is abraded to form a substantially even surface, and the resin layer is cured by heating the resin high enough to cross link and polymerize the resin.

3 Claims, 3 Drawing Sheets

"PRIOR ART"

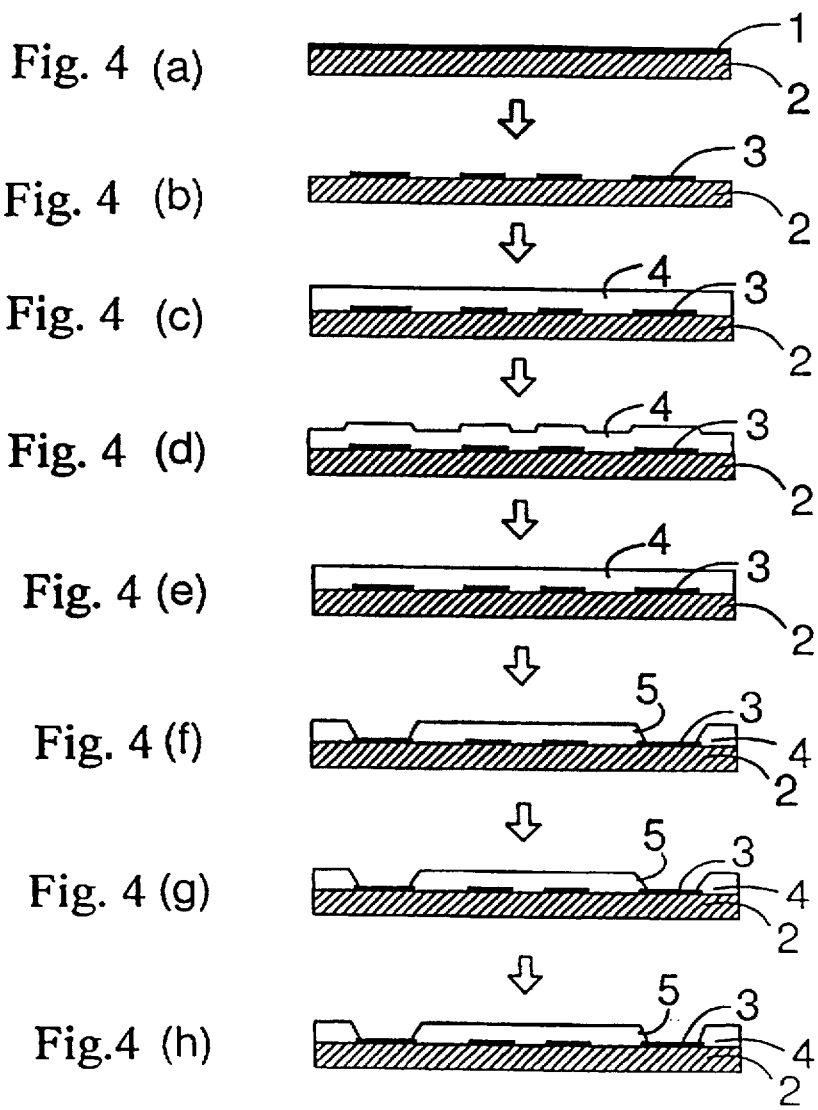

METHOD OF FORMING A RESIN LAYING IN A SURFACE LAMINATED CIRCUIT

FIELD OF THE INVENTION

The present invention relates to printed circuit boards of the surface laminated circuit (SLC) type, and more particularly to a method of forming the resin layer atop underlying surface circuitization, i.e., surface circuitization on the surface of the underlying substrate, to avoid projection or transmission of the wiring pattern relief through the resin layer to the external surface thereof.

BACKGROUND OF THE INVENTION

A surface laminated circuit printed circuit board (SLC) normally has a successively laminated structure of a copper clad glass-epoxy laminated printed circuit board as a substrate, a photosensitive epoxy resin as an insulating layer, and a copper plated layer as an external conducting surface layer. A prior art process for fabricating a conventional surface layer circuit printed circuit board (SLC) is shown in FIG. 1.

First, a layer of glass-epoxy dielectric 2 is provided and covered with a copper layer 1 as shown in FIG. 1 (a). Next, the copper layer 1 is patterned by a selective etching as shown in FIG. 1 (b), to form a wiring layer including signal wiring conductor layer 3. Then, as shown in FIG. 1 (c), a solution of photosensitive, thermosetting resin (as photosensitive epoxy resin) in a solvent is applied to the surface to form an insulating resin layer 4.

Next, the solvent is evaporated from the deposited resin insulating layer 4 by a precure heating as shown in FIG. 1 (d). This is followed by an exposure and development step as shown in FIG. 1 (e), to form a "photo viahole" 5. By a "photo viahole" is meant a viahole formed by photographic techniques. Thereafter the resin insulating layer 4 is cured, i.e., polymerized and cross linked, as shown in FIG. 1 (f), and the surface of the resin insulating layer 4 is planarized, e.g., by grinding, as shown in FIG. 1 (g), to provide a flat surface for subsequent processing, as circuitization.

The method of the prior art results in a surface relief on the surface of the resin insulating layer 4, i.e., a patterning in the in the resin insulating layer 4. This patterning or relief is derived from the pattern of the circuit (wiring layer including a signal wiring conductor layer 3) through the resin insulating layer 4 to the surface thereof as shown in FIG. 1 (d). The roughness or elevation of this irregular or ragged structure is, for example, approx. 7 µm for circuit lines 3 that are 18 µm in width in the circuit (wiring layer including a signal wiring conductor layer 3).

When forming a circuit or wiring layer after copper plating the resin insulating layer 4, it is difficult to form a predetermined circuit. This is because the resin insulating layer 4 has an irregular or ragged surface. Thus, to planarize the surface of a resin insulating layer 4, or to control the thickness and/or enhance the adhesion of a resin insulating layer 4, the resin insulating layer 4 is, in general, planarized, for example, by grinding, abrading, or other mechanical processes.

In the prior art after curing a resin insulating layer 4 by a polymerization reaction as mentioned above, the surface of the resin insulating layer 4 was ground. However, grinding a cross linked surface causes both mechanical damage to the insulating layer 4 and, especially with a thinner resin insulating layer 4, cracks reaching to a circuit 3 (wiring layer) in the inner layer. It has heretofore been thought that in order to prevent the occurrence of cracks reaching to the underlying circuit (wiring layer) in the inner layer, the resin insulating layer 4 has to be made thicker and therefore implementing a thinner resin insulating layer 4 becomes difficult, by which logic implementing a thinner SLC itself becomes difficult.

On the other hand, in some resins that are both photosensitive and thermosetting, only a surface layer of the order of 5 to 7 µm is photocured on exposure to a light source. In this case, when a developing solution enters holes and dissolves an uncured resin in the photolithographic process, holes are also formed or propagate in the transverse direction. Thus with a thicker resin insulating layer 4, flaws become much larger. When removing these flaws, the top part of holes become larger in diameter.

In a surface laminated circuit printed circuit board (SLC), formability of as small a photo viahole as possible is desired as one means for raising the wiring capability per unit area. Raising the wiring capability has so far been a bottleneck in producing an SLC.

OBJECTS OF THE INVENTION

It is therefore an object of the present invention to provide a resin forming method applicable to fabricating a surface layer wiring printed circuit board (SLC).

It is a further object of the invention to provide a method of fabricating a surface laminated circuit printed circuit board (SLC) which method is effective for implementing a thinner resin insulating layer and raising the wiring capability per unit area in an SLC.

SUMMARY OF THE INVENTION

To achieve the above objects there is provided, according to the present invention, a method of forming an insulating resin layer. The method includes the steps of dissolving a photosensitive thermosetting resin in a solvent to form a solution thereof, applying the resin solution to a substantially uneven circuitized surface, and evaporating the solvent while holding the resin below a temperature at which substantial cross linking and polymerization occurs, and partially solidifying the resin to build up a hardness high enough to withstand planarization by, e.g., machine grinding. The surface of the resin is then ground or abraded to form a substantially planar surface; and thereafter the planarized surface is cured to a final degree of hardness.

Also, it is preferable that the temperature used for driving off the solvent in the evaporation process is a precure temperature that is lower than the temperature at which the curing reaction, i.e., the curing and/or cross linking reaction of the thermosetting resin begins. And, it is also preferable that the hardness attained by concentration (evaporation of solvent) at this precure temperature be high enough to withstand a machining, grinding, or abrasion to achieve planarization. The precure time and temperature should be such that after evaporating solvent the solvent content of the resin layer is 16 wt % or less.

The resin solution is partially solidified by evaporating the solvent. The concentrated resin layer has a hardness that is high enough to withstand planarization by, e.g., machine grinding, without problems. In this way a crack in the resin layer is unlikely to occur and a small crack disappears by fusion in curing even if it occurs. Applying this resin forming method to an SLC prevents a crack in the insulating resin layer from occurring and propagating, thus enabling a thinner resin insulating layer to be implemented. With a thinner resin insulating layer, forming a small diameter photo viahole becomes possible, thereby enabling an enhancement in wiring capability.

BRIEF DESCRIPTION OF THE FIGURES

FIGS. 4a–4h is a process drawing showing one embodiment of the present invention.

Like numbers denote like elements in FIGS. 1 and 2. 1 is the copper layer, 2 is the glass epoxy insulating board or substrate, 3 is the signal wiring conductor layer on the glass epoxy insulating board or substrate, 4 is the resin insulating layer, and 5 is the photo viahole.

DETAILED DESCRIPTION OF THE INVENTION

Figure 1:
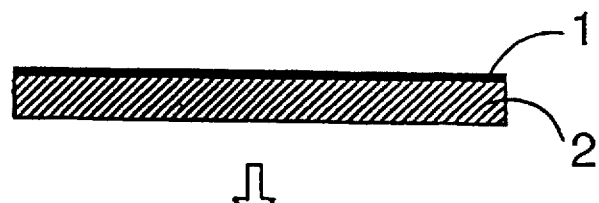
FIGS. 1a–1g are a process flow chart of the prior art showing the essential part of a method for fabricating a surface layer wiring printed circuit board (SLC).
Figure 1:
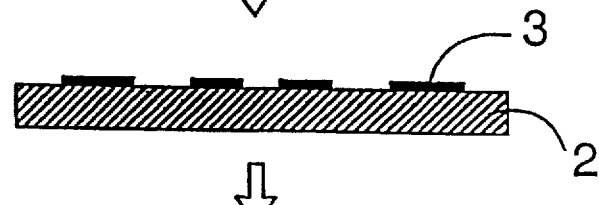
Figure 1:
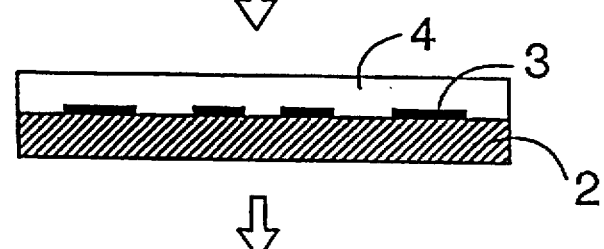
Figure 1:
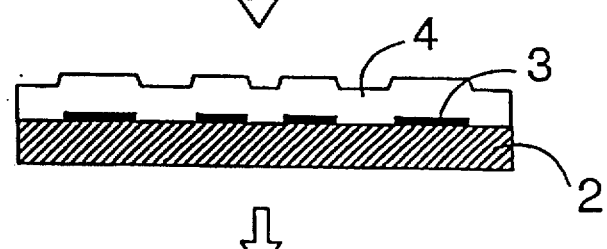
Figure 1:
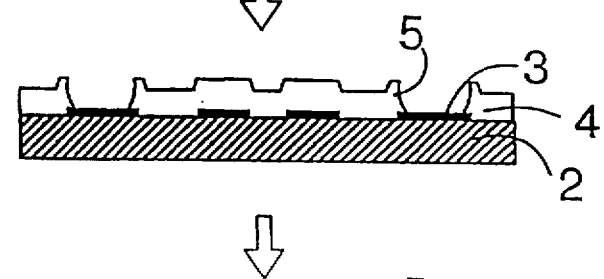
Figure 1:
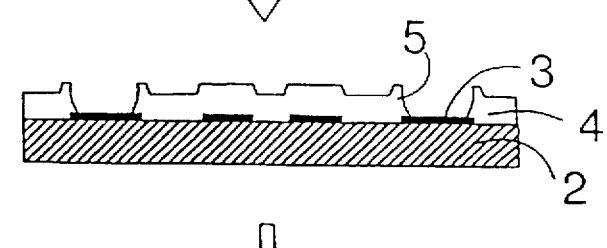
Figure 1:
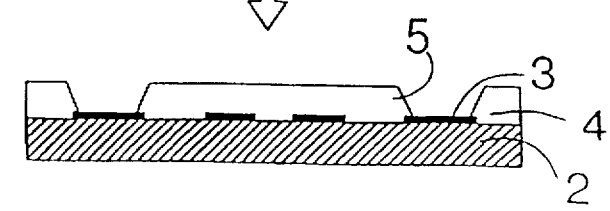

Hereinafter, embodiments of the present invention will be described referring to the drawings. FIG. 4 is a process drawing or flow chart illustrating one embodiment of a resin layer forming method according to the present invention. The present embodiment represents an application of a resin layer forming method to a surface laminated circuit printed circuit board (SLC).

In FIG. 4(a), a glass epoxy substrate 2 has a copper layer 1 laminated thereto. In FIG. 4(b), a circuitization pattern is formed in the copper layer 1 by selective etching. Then, in FIG. 4(c), a photosensitive, thermosetting resin insulating layer 4 is applied atop the wiring layer.

This resin insulating layer 4 is formed by applying a solution of soluble photosensitive, thermosetting resins in a solvent atop the wiring layer 3 circuitization. For example, a photosensitive epoxy resin (Probimer 52) commercially available from CIBA Giegy, is applied to the wiring layer 3 formed surface with a curtain coater.

Suitable photosensitive and thermosetting resins useful in forming the insulating layer 4 are prepolymer resins containing at least one epoxy group and at least one double bond in the prepolymer. The preferred resins are capable of both photodimer bridge forming reactions, and thermal curing. Thermal curing is carried out with a curing agent, such as a trifluoro-amine complex, or dicyandiamide and its derivatives, or melamine and its derivatives. Suitable solvents for dissolving these resins include, for example, ketone solvents, such as cyclohexanone, and cellosolvic solvents, such as methyl cellosolve.

FIG. 4(d) shows a process for evaporating the solvent-resin solution by a precure heating below the temperature or temperature range at which thermal reaction occurs. This heating step serve to drive off solvent and solidify the resin insulating layer 4. In the solidification step for concentrating and partially solidifying a resin insulating layer 4 while holding a temperature below that at which significant cross linking and polymerization occurs, the degree of solidification is such to provide a hardness sufficient to withstand the machine grinding or abrasion for planarization even though the resin is not completely cured and cross linked.

Thus, the temperature for concentration by evaporation needs to be (1) lower than the temperature at which a cure (cross linking and/or polymerization) reaction of the photosensitive and thermosetting resin begins, but (2) high enough to evaporate the solvent.

The time and temperature conditions for evaporation, concentration, and solidification can be determined by a routineer by experimentation. These conditions include, for example, the solvent content of the photosensitive and thermosetting resin solution in the applied layer 4. That is, in an applied state of the above resin solution, a relatively large amount of solvent is contained in the applied layer and with drying, i.e., concentration by evaporation, the solvent content in the applied layer decreases and simultaneously the solidification of the resin layer proceeds.

The solvent content of the applied and concentrated (after evaporation but before cross linking or polymerization) resin insulating layer 4 for planarization by, e.g., abrasion or machine grinding, is preferably 16 wt % or less. If the solvent content is more than 16 wt %, the resin insulating layer 4 still remains tacky, deformable, and adhesive, and abraded abrasive particles are caught in the adhesive resin layer during machine grinding, so that effective grinding becomes difficult to carry out. The most desirable solvent content of a resin insulating layer 4 is 8 to 9 wt % solvent after evaporation.

Once the solvent content in the resin insulating layer 4 becomes less than 16 wt %, a planarization is performed by machine grinding as shown in FIG. 4(e). As shown in FIG. 4(d), an irregular structure corresponding to the shape of the underlying wiring layer 3 is formed on the resin insulating layer 4 and the difference in the height of an irregular structure corresponds approximately to the layer thickness of the underlying wiring layer 3. For example, if the wiring layer 3 is 18 μm thick, the difference in height is 7 μm and accordingly the 7 μm high convex portion is removed by machine grinding in the planarization process. Means for machine grinding to achieve planarity include, for example, belt sanding, buff grinding, and polishing, among others.

In the planarization process, the resin insulating layer 4 should be in a solid state, e.g., by evaporation of the solvent. When planarizing a resin layer 4 in a completely cured state, i.e., a cross-linked and polymerized state, it is likely that for a thin resin insulating layer 4, cracking will occur in the inner layer circuit (wiring layer including the signal conductor wiring layer 3). The resin layer is planarized by, for example, abrasion, such as, machine grinding as shown in FIG. 4(e). Thereafter exposure/development is performed as shown in FIG. 4(f), and a viahole 5 is formed at a predetermined position by the exposure/development.

It should be noted that when foreign materials adhere to or become embedded in the resin layer during photo exposure no light is illuminated on the area overlaid or obscured by foreign materials. Accordingly, a hole is opened by elusion of resin under the foreign material during development. However, if abrasion or grinding is performed before exposure, foreign materials becoming adherent in the precure heating process for removing solvent are removed in grinding, thereby preventing extra holes, other than a viahole, to be generated.

After planarization the resin insulating layer 4 is cured, i.e., cross-linked or polymerized, as shown in FIG. 4(g). If the photosensitive and thermosetting resin is a photosensitive epoxy resin such as Probimer 52, the curing treatment is performed at 130° C. for a predetermined period. The curing time can be determined by simple experimentation by a routineer.

It is to be noted that during the precure, the resin insulating layer 4 is only solidified by the action of evaporation of the solvent and concentration of the resin but remains uncured. An uncured resin layer behaves as a fluid or thermoplastic solid at temperatures on the order 100° C. and minute holes, as cracks, are filled with thermoplastic or fluid resin at that time. Then with rising temperature, the viscosity of resin decreases and a curing, cross-linking, or polymerization reaction starts. This reaction starts very slowly as the temperature exceeds 120° C. After the elapse of time at 130° to 135° C., the curing reaction goes to substantial completion. Thus, even if a crack is generated in the planarization process, the crack is filled up in the thermal curing process.

When plating a resin insulating layer 4 with copper after curing, i.e., curing or polymerization, it is necessary to increase the adhesive strength between the resin layer 4 and the copper plating. This requires roughening the surface of the resin insulating layer 4 by using, e.g., a potassium permanganate solution. However, when the photosensitive and thermosetting resin is photosensitive epoxy resin (Probimer 52), the photocured layer remains unattacked by treatment with oxidizer (e.g., potassium permanganate solution) and consequently only limited adhesive strength can be obtained on the remaining portions.

As shown in FIG. 4(h), a portion (7 μm thick) corresponding to a photocured layer is abraded by, e.g., grinding, and at the same time planarized. In this planarization process, the thickness of the resin insulating layer 4 to be abraded (removed) is slight because of having previously been abraded before (in the grinding process, cf. FIG. 4(e)) and the load for abrasion is reduced, so that the probability of cracks occurring becomes lower. Incidentally, depending on the type of resin constituting the resin insulating layer 4, the grinding process in FIG. 4 (h) can be omitted.

In the steps following FIG. 4(h), copper plating is performed again, to connect a wiring layer, including the signal conductor wiring layer 3, to a copper plated layer on the resin insulating layer 4. This is through photo viahole 5. Thereafter it is possible to successively form a further wiring layer and a resin insulating layer by repeating the processes following FIG. 4(b), and connect a wiring layer to a resin insulating layer 4 through a photo viahole 5, so that a successively laminated surface layer wiring printed circuit board is formed.

The above embodiment shows an example of having an abrasion step for planarization after the concentration and solidification step for partially solidifying the resin insulating layer 4 by removing a solvent, the solidification step being followed by an exposure/development step and a curing step, in succession. In the present invention, the planarization step comes after the concentration and partial solidification step of the resin insulating layer 4 (by removing a solvent) and precedes the final curing process. There is also an alternative embodiment where the exposure/development step follows the solidification step and thereafter the planarizing step and curing step (for polymerization and cross linking) are successively performed.

The invention may be further understood by reference to the following examples:

EXPERIMENTAL EXAMPLE 1

After oxidizing the copper in the circuit board, photosensitive and thermosetting epoxy resin Probimer 52 was dissolved in a solvent (mixed solution of methyl cellosolve, cyclohexane and cellosolve acetate). The solution was applied to the circuit board at various thicknesses with a curtain coater. Thereafter, heat treatment was performed under the following conditions:

(A) One panel was heated at 90° C. for an hour (a condition under which only evaporation of a solvent proceeds and no curing reaction occurs).

(B) Another panel was heated at 130° C. for an hour (a condition for the completion of a curing reaction, where a curing reaction starts at approx. 110° C.)

Subsequently the surface was abraded (ground) with #400 sand paper (belt sander, Kikukawa Iron Works Co., Ltd), followed by curing at 130° C. for an hour, and treatment with permanganate. A panel that was heat treated under the above two conditions was examined under a microscope at 10× magnification Permanganate treatment has an oxidation effect on the resin and comprises the last process for neutralization with acid. Because of the copper being readily soluble in acid, a blackened (oxidized) surface of copper changes color to pink on contact with acid. Thus, on examination of the panel after permanganate treatment, a pink point appears in black if a pin hole is present.

Figure 3:
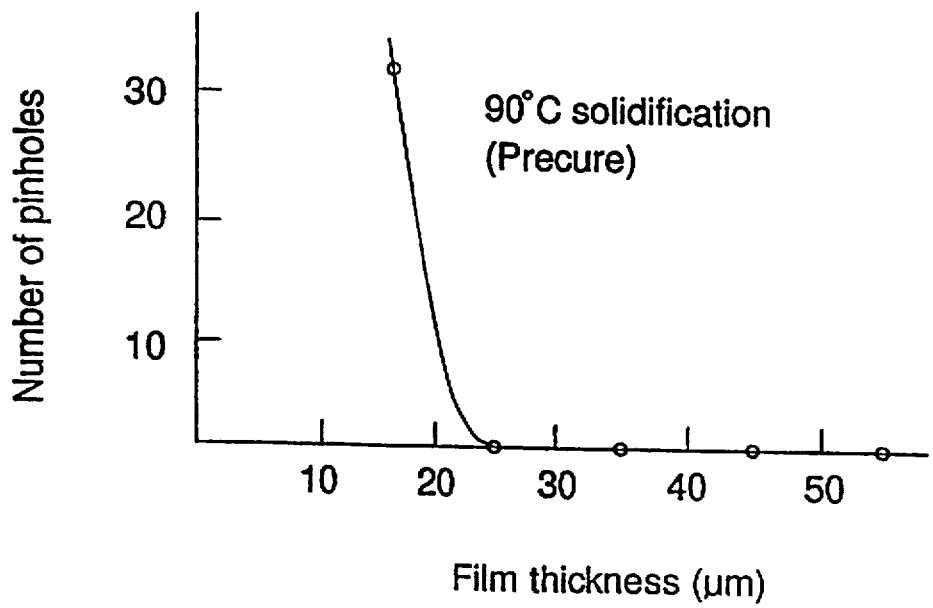
FIG. 3 is a graph showing the relationship between the layer thickness of the resin layer in grinding and occurrence of pinholes for the present invention.
Figure 2:
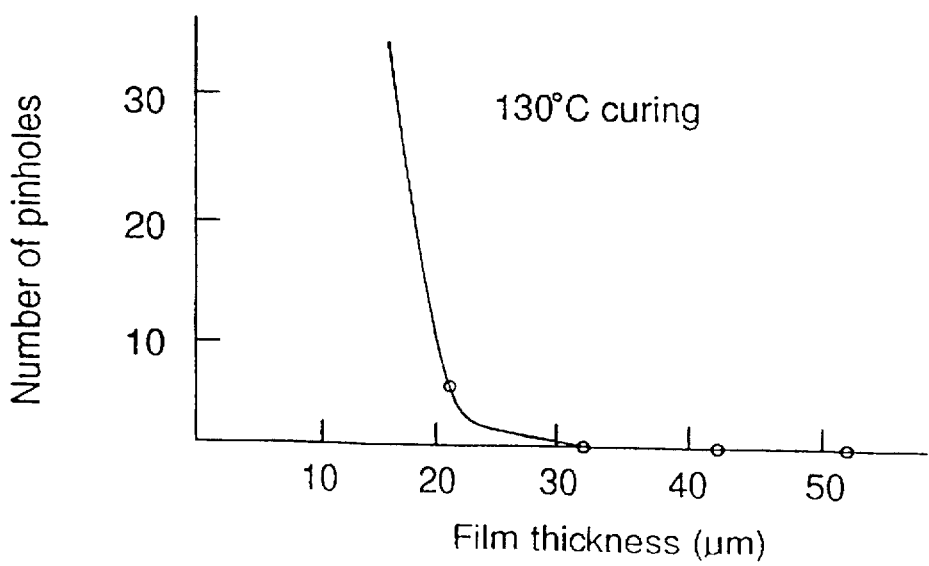
FIG. 2 is a graph showing the relationship between the layer thickness of the resin layer in grinding and occurrence of pinholes for the prior art process.

In accordance with this method, the number of pinholes on a panel (10in.×15in.) treated under each of the above two heat treatment conditions (A) and (B) was measured. FIGS. 2 and 3 show the obtained results. As is clear from FIG. 2 (Prior Art), in a panel heated at 130° C for an hour, pinholes are abruptly generated when the thickness of a resin layer reduces to 30 μm or less. As is clear from FIG. 3, in a panel heated at 90° C. for an hour, no pinholes are generated even when the thickness of a resin layer is as thin as on the order of 25 μm. On the contrary, a Thus, these experimental results show that if surface grinding (abrasion) is performed in a solidified state of a resin layer that is only partially cured, no pinholes are generated even if the resin is relatively thin.

EXPERIMENTAL EXAMPLE 2

After oxidation of copper layer on the circuit board, a solution of Probimer 52 photosensitive thermoplastic epoxy resin is dissolved in a solvent (mixed solution of methyl cellosolve, cyclohexane and cellosolve acetate). The solution is applied at various thickness with a curtain coater. This applied resin surface is heated at a temperature of 90° C. The relationship between the solvent content in the resin layer and the surface after surface grinding with a #400 sand paper (belt sander, Kikukawa Iron Works Co., Ltd), is shown as follows:

| Solvent content in the resin layer | State of grinding |
| --- | --- |
| 8 to 9 wt % | Grinding operation: good |
| 15 to 16 wt % | Grinding operation: good |
| 17 to 18 wt % | Push with a nail causes a slight deformation, and grinding under pressure produces a portion where dropped abrasive particles is caught into the resin layer. |
| 21 wt % | Push with a nail causes a deformation, and grinding under pressure forces dropped abrasive particles to be caught into the resin layer. |

The above experimental results show that the quality of the planarized surface, that is, defects and cracks, is bad when the solvent content in a resin layer exceeds 16 wt %, while the quality of the planarized surface is good when the solvent content in a resin layer lies at or below 16 wt %.

Therefore, planarization of the resin insulating layer by machine grinding is performed after the time when the solvent content in a resin reduces to less than 16 wt %.

According to the present invention, a resin is concentrated and partially solidified by evaporating the solvent. The resulting resin layer is hard enough to withstand planarization by machine grinding, sanding, or abrasion. Planarization can be performed without hindrance. In addition, because planarization is performed in a partially cured or uncured state of the resin layer, no cracking occurs or propagates through the resin. Applying this resin forming method to a surface laminated circuit wiring printed circuit board (SLC) prevents a crack in the resin layer from propagating to the substrate and underlying circuitry, thus enabling a thinner resin insulating layer to be implemented. With a thinner resin insulating layer, forming a minute photo viahole becomes possible, thereby enabling an enhancement in wiring capability.

While the invention has been described with respect to certain preferred embodiments and exemplifications, it is not intended to limit the scope of the invention thereby, but solely by the claims appended thereto.

We claim:

1. A method of forming a surface laminated circuit printed circuit board where a photosensitive thermosetting resin in solution is applied atop a circuitized substrate, comprising the steps of:

concentrating and solidifying the photosensitive thermosetting resin to build up a hardness therein high enough to withstand abrasion by first dissolving the photosensitive thermosetting resin in a solvent and applying the solution to a substantially uneven surface and evaporating solvent at a temperature below the curing temperature of the photosensitive thermosetting resin to thereby form a concentrated, solidified, uncured resin layer;

abrading the surface of said concentrated, solidified, uncured resin layer to thereby form a substantially even abraded resin layer; and curing said abraded resin layer by heating the resin high enough to cross link and polymerize said abraded resin.

2. The method of claim 1, further comprising:

exposing and developing said abraded resin layer after said abrasion and before said curing to form a photo via.

3. The method of claim 1, further comprising:

exposing and developing said concentrated, solidified, uncured resin layer after said solidification and before said abrasion to form a photo via.

* * * * *

UNITED STATES PATENT AND TRADEMARK OFFICE
CERTIFICATE OF CORRECTION

PATENT NO. : 5,766,825
DATED : 06/16/98
INVENTOR(S) : Masaharu Shirai, Shuhichi Okabe, Yoshiteru Kohno It is certified that error appears in the above-identified patent and that said Letters Patent is hereby corrected as shown below:

```
On the title page, item [54] and in Col. 1, line 1,
     change "LAYING" to "LAYER".
```

Signed and Sealed this

Fifteenth Day of September, 1998

*Attest:*

BRUCE LEHMAN

*Attesting Officer*   *Commissioner of Patents and Trademarks*